(12) United States Patent
Nguyen et al.

(10) Patent No.: US 6,800,254 B1
(45) Date of Patent: Oct. 5, 2004

(54) VISUAL INDICATOR COLD TRAPPING SYSTEM

(75) Inventors: Tue Nguyen, Fremont, CA (US); Craig Alan Bercaw, Los Gatos, CA (US)

(73) Assignee: Tegal Corporation, Petaluma, CA (US)

( * ) Notice: Subject to any disclaimer, the term of this patent is extended or adjusted under 35 U.S.C. 154(b) by 891 days.

(21) Appl. No.: 09/589,633

(22) Filed: Jun. 7, 2000

(51) Int. Cl.[7] .............................................. B01D 50/00
(52) U.S. Cl. ........................ 422/168; 422/169; 422/173
(58) Field of Search .............................. 422/168, 169, 422/173

(56) References Cited

U.S. PATENT DOCUMENTS

| | | | | |
|---|---|---|---|---|
| 3,645,127 A | * | 2/1972 | Mongodin et al. ........... | 73/40.7 |
| 4,413,675 A | * | 11/1983 | Gano .......................... | 165/119 |
| 4,468,001 A | * | 8/1984 | Stanic .......................... | 251/86 |
| 4,973,002 A | * | 11/1990 | Waller et al. ............. | 241/46.17 |
| 5,015,503 A | * | 5/1991 | Varrin et al. ................... | 117/99 |
| 5,045,703 A | * | 9/1991 | Wieboldt et al. ............ | 250/352 |
| 5,240,556 A | * | 8/1993 | Ishikawa et al. ............. | 216/67 |
| 6,099,649 A | * | 8/2000 | Schmitt et al. ............. | 118/715 |
| 6,107,198 A | * | 8/2000 | Lin et al. ..................... | 438/680 |
| 6,299,513 B1 | * | 10/2001 | Tsuihiji et al. ................ | 451/88 |
| 6,402,806 B1 | * | 6/2002 | Schmitt et al. ................ | 75/414 |
| 2001/0041374 A1 | * | 11/2001 | Hintermaier et al. .......... | 438/3 |
| 2002/0006769 A1 | * | 1/2002 | Tsuihiji et al. ................ | 451/53 |
| 2002/0190408 A1 | * | 12/2002 | Houston et al. .............. | 264/10 |

FOREIGN PATENT DOCUMENTS

JP          02001126999 A    *  5/2001

OTHER PUBLICATIONS

Derwent—ACC—No.: 2003–137366 Ahn et al.*
*Saftey and environmental concerns of CVD copper precursors*, by Bob Zorich, Mary Majors, Solid State Technology, Sep. 1998, vol. 41, Issue 9.

* cited by examiner

*Primary Examiner*—Kiley Stoner
(74) *Attorney, Agent, or Firm*—Fliesler Meyer LLP

(57) ABSTRACT

A visual indicator cold trapping system is provided to allows the visual inspection of the adequacy of a cold trap. The cold trapping system includes a hollow transparent connector operatively connected to the input of the cold trap whereby a visual indication of material collected at the transparent connector shows that there is a problem at the upstream flow of the cold trap. Alternatively, the cold trapping system includes a hollow transparent connector operatively connected to the output of the cold trap whereby a visual indication of material collected at the transparent connector shows that there is a problem at the downstream flow of the cold trap.

33 Claims, 4 Drawing Sheets

VISUAL INDICATOR COLD TRAPPING SYSTEM

FIELD OF THE INVENTION

The present invention relates generally to apparatus for processing of a semiconductor wafer, and more particularly to a cold trapping system with a visual indicator to allow monitoring the adequacy of the cold trap.

BACKGROUND OF THE INVENTION

Semiconductor processes use vapor precursors for processing of thin films on an integrated circuit (IC) substrate. The majority of these vapor precursors, together with their by-products are pumping out and exhausted to a waste stream.

It is very expensive to collect and dispose of the precursor exhaust products. Further, these non-reactive precursors and these byproducts can be hazardous and harmful to the environment. The IC industry is forced to conform to ever more stringent regulations concerning the storage and disposal of these wastes.

It is very inconvenient to collect waste as a gas because it is difficult to transport and bulky to store. It is more convenient if the waste can be converted, at least partially into a solid or liquid waste. It is well known to use cold traps to completely condense some chemical vapors. It is also well known to use cold traps to condense elements of a precursor to at least simplify the waste collection process.

In a chemical vapor deposition (CVD) process, high temperature process is often used. Because of the low efficiency of the CVD process, a hot trap is recommended for completing the CVD reaction, leaving only the by-products to the exhaust stream. An example is copper CVD process. Copper CVD process uses copper-hfac-tmvs precursor to deposit copper on a hot surface (~200° C.) following the reaction:

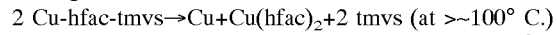

2 Cu-hfac-tmvs→Cu+Cu(hfac)$_2$+2 tmvs (at >~100° C.)

The reaction occurs at temperature higher than ~100° C. The efficiency of this reaction is roughly 10–20%, thus 80–90% of the precursor leaves the process chamber un-reacted. A cold trap would then collect the precursor Cu-hfac-tmvs, and the by-products Cu(hfac)$_2$ and tmvs. Using a hot trap before the cold trap, most of the precursor would further reacts, leaving only the by-products in the waste stream.

FIG. 1 shows a prior art apparatus for a cold trap. The precursor exhaust enters the cold trap at the cold trap input 23, converting some elements of the exhaust into non-gaseous phase at the waste collection surface 15, and exhaust the gaseous phase to the cold trap output 25. The cooler means 37 serves to cool the waste collection surface 15 to a trapping temperature where the precursor exhaust reacts and separates into non-gaseous and gaseous components. The non-gaseous components trapping at the waste collection surface 15 could travel to the waste drain collection 45. The waste collection 45 has a drain valve 43 to keep the waste stored.

The major disadvantage of this prior art is the inability to quickly evaluate the adequacy of the cold trap. If the cold trap is not efficient enough, material can travel downstream of the cold trap and might deposit outside of the cold trap. If there is some problem upstream of the cold trap, such as a cold section of the pipe leading to the cold trap, material can deposit outside of the cold trap.

A co-application titled "High pressure chemical vapor trapping system" of the same author, Tue Nguyen, provides a high pressure trapping system composing of a hot trap for completing the reaction and a cold trap for trapping the residue.

FIG. 2 shows the high pressure chemical vapor trapping system. The exhaust from the processing chamber 110 is pumped away by the vacuum pump 130. The pressure in the process chamber foreline 115 is normally low, in the range of torr or millitorr pressure. After the vacuum pump, the pressure is almost atmospheric at the vacuum pump exhaust 135. The hot trap 120 converts un-reacted precursors to the precursor by-products, and the cold trap 140 converts the gas phase by-products to non-gaseous phase by-products for easily transport and storage. This system connects to the downstream of the vacuum pump to take advantage of the high pressure at the pump exhaust. By not disturbing the chamber configuration, there is no potential contamination of the process. Using this system, there is no observable degradation to the vacuum pump, and no contamination to the process chamber.

There is no visual indicator to show whether or not the hot trap is converting all reaction elements, and there is no visual indicator that the cold trap is trapping all waste elements.

It would be advantageous if there is a visual indicator allowing the monitoring of the adequacy of the cold trap.

SUMMARY OF THE INVENTION

Accordingly, a visual indicator cold trapping system to allow monitoring the adequacy of the cold trap is provided. The system comprises a cold trap having an input port, a output port, a waste collection surface, a cooler means to cool the trap to a temperature in the range from 25 degrees to minus 200 degrees Celsius. The cold trap provides non-gaseous wastes at the waste collection surface, and gaseous exhaust at the gas output port. For visual indicator, the cold trapping system comprises a plurality of hollow transparent connectors.

In some aspects of the invention, the hollow transparent connector is connected to the input of the cold trap. Its transparency property allows the visual inspection of the cold trap for any material deposited there. Any material deposited in this transparent connector implies that there is problem upstream of the cold trap. Since there is material deposited in the connector section, it is likely that there is also material deposited in the pipe upstream of the cold trap. The visual indicator allows the problem to be spotted immediately and to alert the operator to take appropriate actions. In some aspects of the invention, the transparent connector has a heater means to bring its temperature to be the same as the upstream pipe. This allows the connector to be at the same temperature as the upstream pipe, thus eliminates the possibility of material deposition due to temperature difference. In some aspects of the invention, the input of the cold trap has a transparent section, served as the connector itself.

In some aspects of the invention, the hollow transparent connector is connected to the output of the cold trap. Any material deposited in this transparent connector implies that there is problem downstream of the cold trap. Since there is material deposited in the connector section, there is likely that there is material exhausted from the cold trap without being trapped there. In some aspects of the invention, the transparent connector has a heater means to bring its temperature to be the same as the downstream pipe. This allows the connector to be at the same temperature as the downstream pipe, thus eliminates the possibility of material deposition due to temperature difference.

In some aspects of the invention, the visual indicator cold trapping system further comprises a waste drain with a hollow transparent connector. In some aspects of the invention, the drain section is transparent to allow visual inspection of the collected material.

In other aspects of the invention, a high pressure chemical vapor trapping system to separate and collect elements of a chemical vapor exhaust with a visual indicator cold trap is provided. The system comprises a hot trap and a visual indicator cold trap connected to each other as a single unit. The exhaust pump is upstream of the trapping system, providing a high pressure in the hot trap.

The present invention system comprises a hot trap having an input port, a gas output port, a waste collection surface, and a heater. The heater heats the hot trap to a temperature in the range from 100 to 500 degrees Celsius. The hot trap accepts chemical vapor such as the above-described copper precursors and provides non-gaseous wastes at the waste collection surface, and gaseous exhaust at the gas output port at a pressure substantially the same as the input pressure.

The system also comprises a visual indicator cold trap having an input port operatively connected to the gas output port of the hot trap, a gas output port, a waste collection surface, and a plurality of hollow transparent connectors operatively connected to the ports of the cold trap. The cold trap cools the chamber to a temperature in the range from 25 degrees to minus 200 degrees Celsius. The cold trap provides non-gaseous wastes at the waste collection surface, and gaseous exhaust at the gas output port at a pressure substantially the same as the input pressure. In this manner, vapor byproducts are collected in two stages. The visual indicator allows the determination of the adequacy of the trapping system. If the hot trap is not adequate, meaning allowing waste elements to escape the hot trap, the waste elements will show up at the visual indicator at the input of the cold trap. If the cold trap is not adequate, meaning allowing waste elements to escape the cold trap, the waste elements will show up at the visual indicator at the output of the cold trap. In some aspects of the invention, the cold trap further comprises a drain section for waste storage. The drain section also comprises a visual indicator for visual inspection.

The invention also provides that an exhaust pump, operatively connected to hot trap input port, provides gaseous exhaust to the hot trap. In this manner, a high pressure is created at the hot trap gas input port.

In some aspects of the invention, the chemical vapor exhaust is a MOCVD precursor such as Cu(hfac) combined with a ligand (Cu(hfac)L). Then, the first chamber includes a plurality of metal plates, or other heated structures extending into the hot trap. These metal plates are of the same metal as in the MOCVD precursor and act as metal collection surfaces. That is, the collection surface acts as the heater in the hot trap. As the precursor vapor is heated, metal from the precursor is deposited on the metal plates as the heat completes the chemical reaction. The metal collection surface/heaters are reclaimed from recycling when a predetermined amount of solid metal waste is collected on the collection surfaces.

In some aspects of the invention, the both the hot and cold chambers are easily removable for efficient recycling of the collected waste materials. A first exhaust line extends to the exhaust input port of the hot trap. The first line including at least one valve to block the passage of gas from the deposition chamber. Likewise, a second exhaust line extends from the hot trap gaseous exhaust port, and also includes at least one valve to block the escape of gas from the second line.

The hot trap includes a first valve at the exhaust input port and a second valve at the gaseous exhaust port. The hot trap is removable from the first and second lines for waste removal, when full. In this manner, the first and second valves in said hot trap prevent exhaust from escaping from the trap, when the trap is disconnected. The valves in the first and second lines prevent the escape of exhaust from the system when the hot trap is removed. In the same manner, valves are used in the gas lines going to and from the cold trap, and also used in the input and output gas ports. Then, the cold trap is also easily removable without allowing the escape of vapors from the system.

Sometimes the hot trap collection surfaces are biased with a voltage, whereby charged metal from the MOCVD precursor is attracted and deposited on said collection surface. In other aspects of the invention, the hot trap includes a second input port to accept a catalyst selected from the group consisting of water, alcohol, and ammonia, whereby the catalyst furthers the chemical reaction in the first chamber.

DETAIL DESCRIPTION OF THE PREFERRED EMBODIMENT

Figure 1:
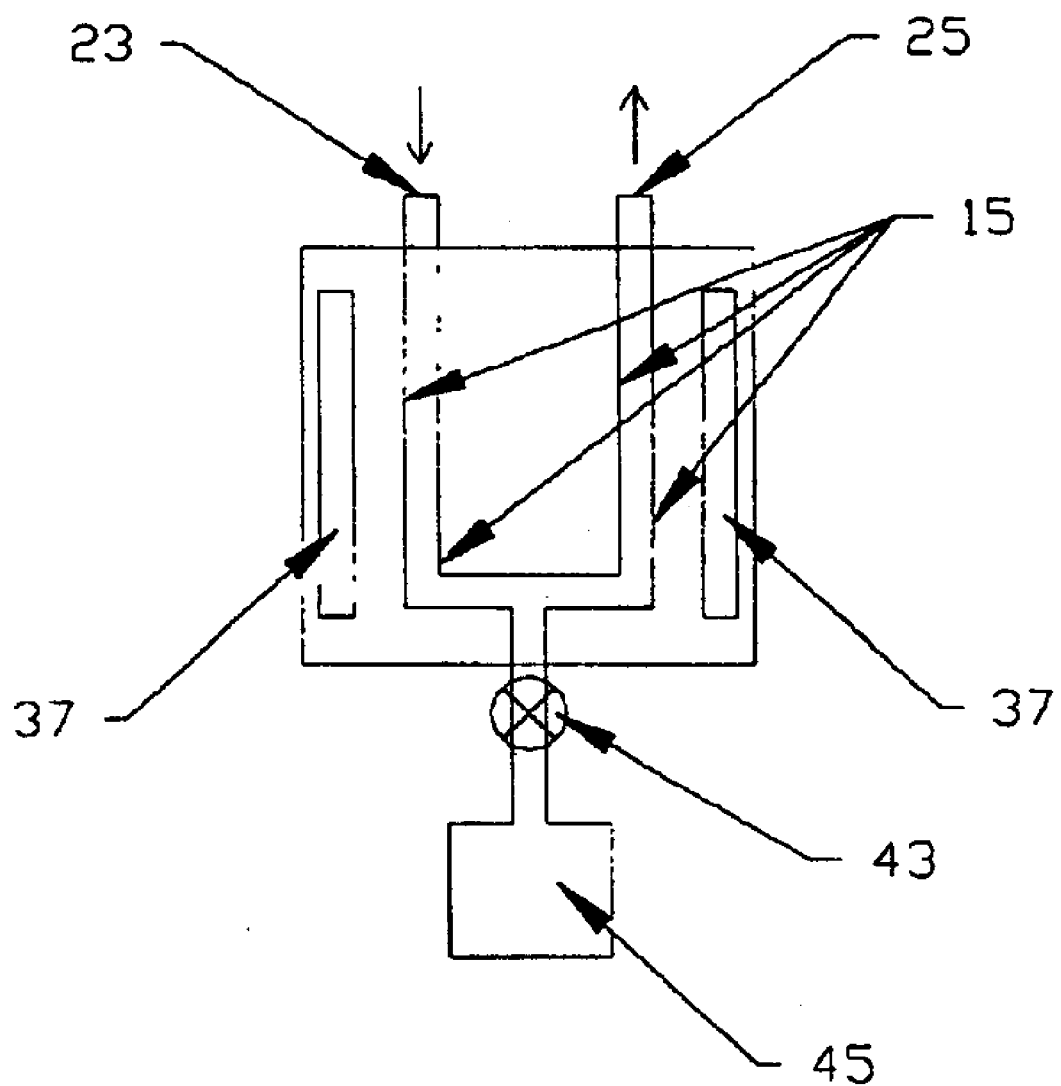
FIG. 1 shows a prior art cold trap.
Figure 2:
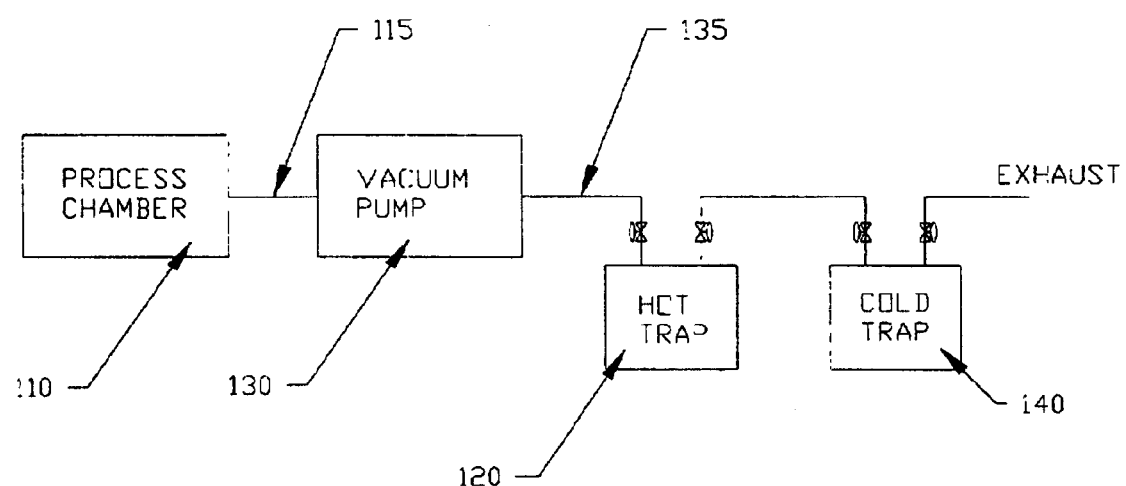
FIG. 2 shows the co-application invention of the high pressure chemical vapor trapping system.
Figure 3:
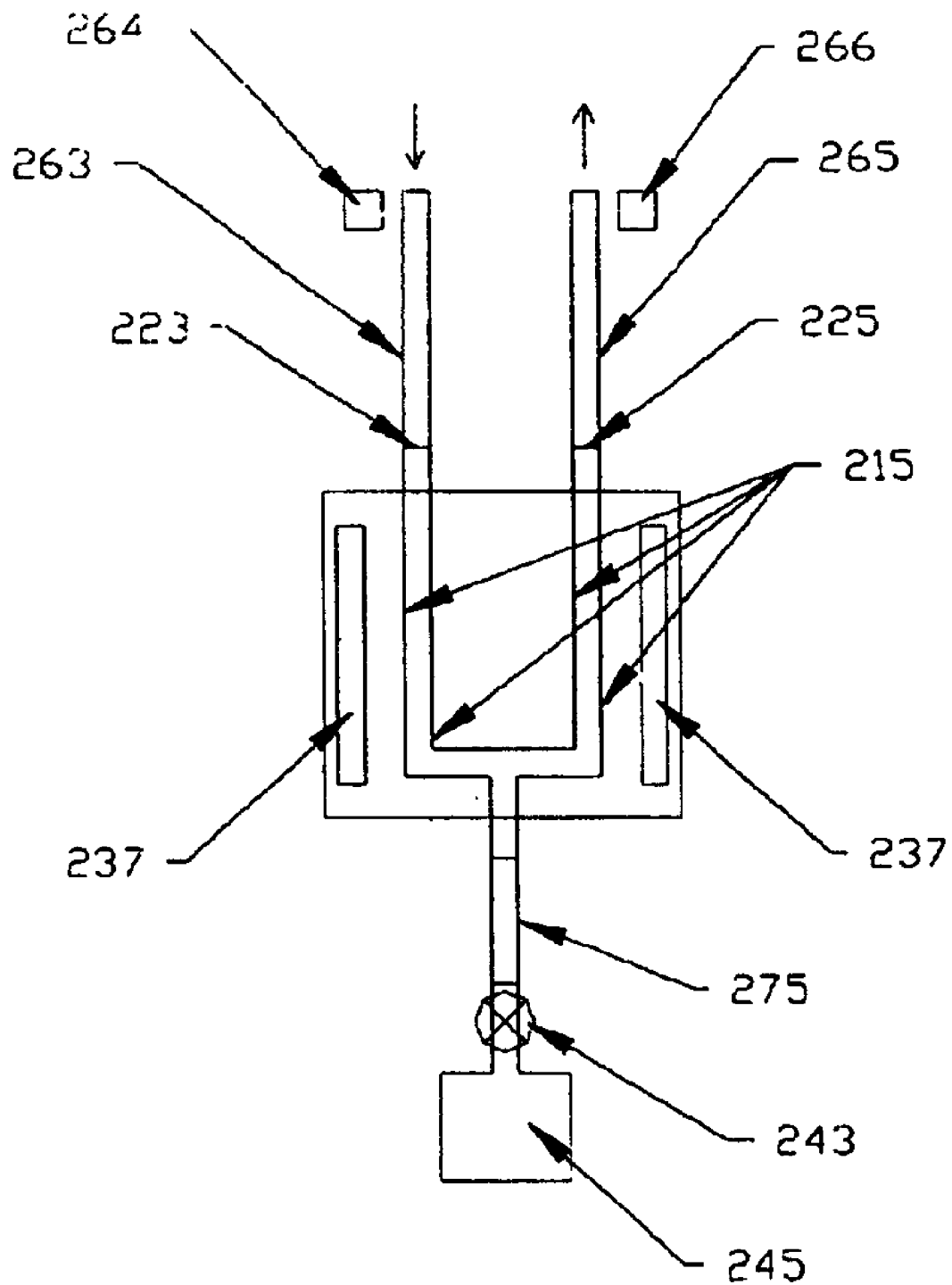
FIG. 3 shows the present invention of the visual indicator cold trapping system.

FIG. 3 shows the present invention of the visual indicator cold trapping system. There are 3 visual indicators, visual indicator 263 at the input port 223 of the cold trap, visual indicator 265 at the output port 225 of the cold trap, and visual indicator 275 at the drain port of the cold trap. The visual indicators 263 and 266 have optional heater means 264 and 266 to keeping the ends of the visual indicators at the same temperature as the incoming and outgoing pipe connection. The input port 223 brings the chemical vapor exhaust to the waste collection surface 215 to collect the non-gaseous element of the chemical vapor exhaust. The gaseous element will leave the cold trap at the output port 225. The cooler means 237 cools the waste collection surface to the trapping temperature, where the chemical vapor exhaust reacts and converts to non-gaseous element. The drain section 245 collects all the waste with the drain valve 243 to prevent waste vapor from escaping.

Figure 4:
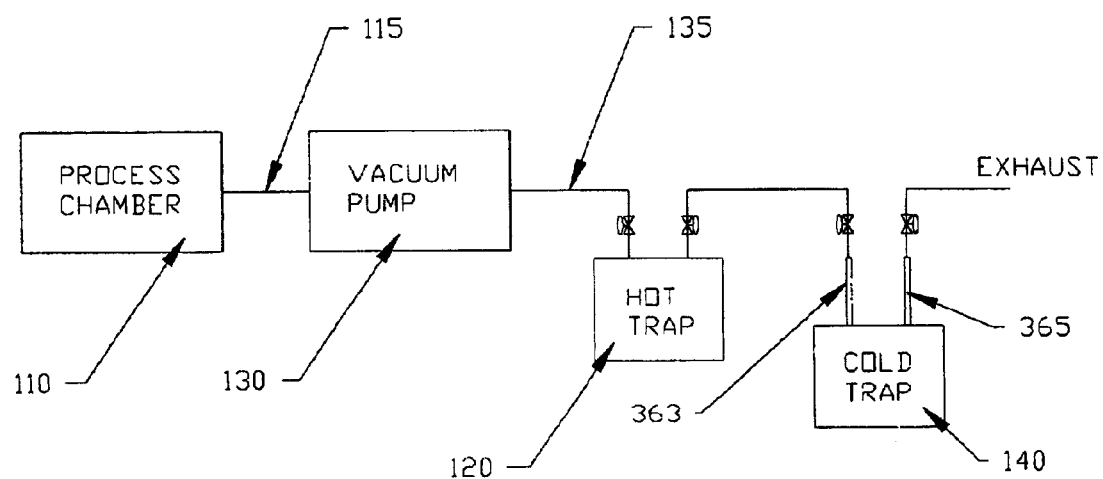
FIG. 4 shows the present invention of the high pressure chemical vapor trapping system using the visual indicator.

FIG. 4 shows the present invention of the high pressure chemical vapor trapping system using the visual indicator. The cold trap of the trapping system has an input visual indicator 363 and an output visual indicator 365. Input visual indicator 363 allows the determination of the adequacy of the hot trap, and the output visual indicator 365 allows the determination of the adequacy of the cold trap.

What is claimed is:

1. A visual indicator cold trap apparatus comprising:
 a) a cold trap comprising:
   an input port;
   an output port;
   a waste collection surface;
 b) a cooling means to cool the trap to a trapping temperature;
 c) a plurality of hollow transparent connectors operatively connected to the ports of the cold trap;

whereby the cold trap accepts chemical vapor exhaust at the input port, collects non-gaseous wastes from the chemical vapor exhaust at the waste collection surface, and exhausts gaseous exhaust at the output port, and the hollow transparent connectors allow the visual inspection of the adequacy of the cold trap.

2. A visual indicator cold trap apparatus as in claim 1 further comprising at least one heater means for heating an input section of the hollow transparent connectors to prevent material trapping outside of the hollow transparent connectors.

3. A visual indicator cold trap apparatus as in claim 1 further comprising the trapping temperature as in the range from 25 to negative 200 degrees Celsius.

4. A visual indicator cold trap apparatus as in claim 1 further comprising one of the hollow transparent connectors is operatively connected to the input port of the cold trap, whereby a visual indication of material collected at the transparent connector can show that non-gaseous waste collects upstream of the cold trap apparatus.

5. A visual indicator cold trap apparatus as in claim 1 further comprising one of the hollow transparent connectors being operatively connected to the output port of the cold trap, whereby a visual indication of material collected at the hollow transparent connector shows that the cold trap is inefficient.

6. A visual indicator cold trap apparatus as in claim 1 in which the input port of the cold trap is transparent and the hollow transparent connector operatively connected to the input port is the transparent input port itself.

7. A visual indicator cold trap apparatus as in claim 1 in which the output port of the cold trap is transparent and the hollow transparent connector operatively connected to the output port is the transparent output port itself.

8. A visual indicator cold trap apparatus as in claim 1 in which the cold trap further comprises a drain port to collect the waste material.

9. A visual indicator cold trap apparatus as in claim 8 in which at least one of the hollow transparent connectors is operatively connected to the drain port of the cold trap, whereby a visual indication of material collected at the transparent connector can show material collected at the cold trap.

10. A visual indicator cold trap apparatus as in claim 8 in which the drain port of the cold trap is further comprised of a hollow transparent connector, whereby a visual indication of the hollow transparent connector of the drain port can show that there is material collected at the cold trap.

11. A high pressure chemical vapor trapping system to separate and collect elements of a chemical vapor exhaust, the system comprising:
  a) a first processing chamber having a first chamber input port, a first chamber gas output port, a first chamber waste collection surface, and a chamber heater to heat the first processing chamber to a first temperature, the first processing chamber accepting chemical vapor exhaust at the first chamber input port at a trapping pressure to further a chemical reaction, and providing non-gaseous wastes at the first chamber waste collection surface, and providing gaseous exhaust at the first chamber gas output port; and
  b) a second processing chamber having a second chamber input port operatively connected to the first chamber gas output port, a second chamber gas output port, a second chamber waste collection surface, a second chamber cooler to cool the second processing chamber to a second temperature, less than the first temperature, and a plurality of hollow transparent connectors operatively connected to the ports of the second processing chamber,
  whereby the second processing chamber accepts chemical vapor exhaust at the second chamber input port, collects non-gaseous wastes at the second chamber waste collection surface, and exhausts gaseous exhaust at the second chamber gas output port, whereby vapor byproducts are collected in the first and the second processing chambers, and the hollow transparent connectors allow the visual inspection of the adequacy of the second processing chamber.

12. A high pressure chemical vapor trapping system as in claim 11 in which the first processing chamber first temperature ranges from 100 to 500 degrees Celsius and in which the second processing chamber second temperature ranges from 25 degrees to negative 200 degrees Celsius.

13. A high pressure chemical vapor trapping system as in claim 11 wherein the chemical vapor exhaust at the first chamber input port is a MOCVD precursor, in which said first chamber waste collection surface is biased with a voltage, whereby charged metal from the MOCVD precursor is attracted to and deposited on the first chamber waste collection surface.

14. A high pressure chemical vapor trapping system as in claim 13 wherein the bias voltage is in the range from −10 to −100 volts DC, whereby positively charged metal from the MOCVD precursor is attracted and deposited on the first chamber waste collection surface.

15. A high pressure chemical vapor trapping system as in claim 13 wherein the bias voltage is in the range from 10 to 100 volts DC, whereby negatively charged metal from the MOCVD precursor is attracted and deposited on the first chamber waste collection surface.

16. A high pressure chemical vapor trapping system comprising:
  a hot trap that receives an exhaust from a vacuum pump at a hot trap input and allows further reaction of a plurality of precursors remaining in the exhaust;
  a second hot trap input port to accept a catalyst to further the chemical reaction in the hot trap, wherein the catalyst is selected from the soup consisting of oxygen, water, alcohol, and ammonia;
  a cold trap that receives at a cold trap input a plurality of gaseous by-products from an output of the hot trap, wherein the cold trap converts said gaseous by-products to non-gaseous by-products; and
  at least one visual indicator functionally associated with the cold trap.

17. A high pressure chemical vapor trapping system as in claim 11 in which one of the plurality of hollow transparent connectors operatively connected to the ports of the second processing chamber is operatively connected to the input port of the second processing chamber, whereby visualization of material collected at the transparent connector connected to the input port of the second processing chamber indicates that non-gaseous waste collects upstream of the second processing chamber.

18. A high pressure chemical vapor trapping system as in claim 11 in which one of the plurality of hollow transparent connectors operatively connected to the ports of the second processing chamber is operatively connected to the output port of the second processing chamber, whereby visualization of material collected at the transparent connector indicates that the second processing chamber is inefficient.

19. A high pressure chemical vapor trapping system as in claim 11 wherein the second processing chamber further comprises a drain port to collect non-gaseous waste.

20. An apparatus for processing at least one semiconductor wafer which can be checked visually to monitor processing, the apparatus comprising:
a processing chamber;
a vacuum pump operatively connected with the processing chamber that pumps an exhaust away from the processing chamber;
a hot trap that receives the exhaust from the vacuum pump at a hot trap input and allows further reaction of a plurality of precursors remaining in the exhaust;
a cold trap that receives at a cold trap input a plurality of gaseous by-products from an output of the hot trap, wherein the cold trap converts said gaseous by-products to non-gaseous by-products and exhausts; and
at least one transparent connector functionally associated with the cold trap.

21. The apparatus for processing at least one semiconductor wafer as in claim 20 wherein the at least one transparent connector functionally associated with the cold trap is a hollow transparent connector operatively connected with the cold trap input.

22. The apparatus for processing at least one semiconductor wafer as in claim 20 wherein the at least one transparent connector functionally associated with the cold trap is a hollow transparent connector operatively connected with the cold trap output.

23. The apparatus for processing at least one semiconductor wafer as in claim 20 wherein the transparent connector functionally associated with both the cold trap input and cold trap output is a hollow transparent connector.

24. The apparatus for processing at least one semiconductor wafer as in claim 20 further comprising a waste drain connected with the cold trap with a hollow transparent connector to allow visual inspection of the collected material.

25. The apparatus for processing at least one semiconductor wafer as in claim 20 further comprising the cold trap is in the temperature range from 25 degrees to −200 degrees Celsius.

26. The apparatus for processing at least one semiconductor wafer as in claim 20 further comprising a plurality of heated collection surfaces extending into the hot trap, the heated collection surfaces acting as metal collection surfaces.

27. The apparatus for processing at least one semiconductor wafer as in claim 20 wherein the hot trap contains a plurality of heated collection surfaces that are biased with a voltage.

28. The apparatus for processing at least one semiconductor wafer as in claim 20 further comprising a second hot trap input port to accept a catalyst selected from the group consisting of water, alcohol, and ammonia.

29. A visual indicator cold trap apparatus comprising:
a) a cold processing chamber trap comprising:
an input port;
an output port;
a waste collection surface;
b) a cooling means to cool the trap to a trapping temperature;
c) a transparent connector operatively connected to at least one of the input port and the outputport of the cold trap;
whereby the cold trap accepts chemical vapor exhaust at the input port, to further a chemical reaction, and collects non-gaseous wastes from the chemical vapor exhaust at the waste collection surface, and exhausts gaseous exhaust at the output port, and the transparent connector allows the visual inspection of the adequacy of the cold trap.

30. A high pressure chemical vapor trapping system to separate and collect elements of a chemical vapor exhaust, the system comprising:
a) a hot trap having a hot trap input port, a hot trap gas output port, a hot trap waste collection surface, and a hot trap heater to heat the hot trap to a first temperature, the hot trap accepting chemical vapor exhaust at the hot trap input port at a trapping pressure to further a chemical reaction, and providing non-gaseous wastes at hot trap waste collection surface, and providing gaseous exhaust at the hot trap gas output port; and
b) a cold trap having a second chamber input port operatively connected to the hot trap gas output port, a cold trap gas output port, a cold trap waste collection surface, a cold trap cooler to cool the cold trap to a second temperature, less than the first temperature, and a plurality of hollow transparent connectors operatively connected to the ports of the cold trap,
whereby the cold trap accepts chemical vapor exhaust at the cold trap input port, collects non-gaseous wastes at the cold trap waste collection surface, and exhausts gaseous exhaust at the cold trap gas ouput port, whereby vapor by-products are collected in the hot trap and in the cold trap, and the hollow transparent connectors allow the visual inspection of the adequacy of the cold trap.

31. An apparatus for processing at least one semiconductor wafer which can be checked visually to monitor processing, the apparatus comprising:
a processing chamber;
a vacuum pump operatively connected with the processing chamber that pumps an exhaust away from the processing chamber;
a hot trap that receives the exhaust from the vacuum pump at a hot trap input and allows further reaction of the exhaust;
a cold trap that receives at a cold trap input the exhaust from an output of the hot trap, wherein the cold trap allows further reaction of the exhausts; and
at least one transparent connector associated with the cold trap.

32. An apparatus for processing at least one semiconductor wafer which can be checked visually to monitor processing, the apparatus comprising:
a processing chamber;
a cold trap that receives at a cold trap input an exhaust from an output of a hot trap, wherein the cold trap allows further reaction of the exhausts; and
at least one transparent connector associated with the cold trap.

33. An apparatus for processing at least one semiconductor wafer which can be checked visually to monitor processing, the apparatus comprising:
a processing chamber;
a hot trap that receives an exhaust from a vacuum pump at a hot trap input and allows further reaction of the exhaust;
a cold trap that receives at a cold trap input the exhaust from an output of the hot trap, wherein the cold trap allows further reaction of the exhausts; and
at least one transparent connector associated with the cold trap.

* * * * *

UNITED STATES PATENT AND TRADEMARK OFFICE
CERTIFICATE OF CORRECTION

PATENT NO.   : 6,800,254 B1
DATED        : October 5, 2004
INVENTOR(S)  : Nguyen et al.

It is certified that error appears in the above-identified patent and that said Letters Patent is hereby corrected as shown below:

Column 6,
Line 41, delete "soup" and insert -- group --, therefor.

Signed and Sealed this

First Day of March, 2005

JON W. DUDAS
*Director of the United States Patent and Trademark Office*